United States Patent
Maheshwari

(10) Patent No.: US 8,595,398 B2
(45) Date of Patent: Nov. 26, 2013

(54) MULTI-PORT MEMORY DEVICES AND METHODS

(75) Inventor: Dinesh Maheshwari, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 828 days.

(21) Appl. No.: 12/720,517

(22) Filed: Mar. 9, 2010

(65) Prior Publication Data

US 2010/0228908 A1 Sep. 9, 2010

Related U.S. Application Data

(60) Provisional application No. 61/158,676, filed on Mar. 9, 2009.

(51) Int. Cl.
*G06F 13/00* (2006.01)
(52) U.S. Cl.
USPC ..................................... 710/100; 365/230.05
(58) Field of Classification Search
USPC .......... 326/37–41; 365/230.05; 713/189–194; 711/100, 147–153; 710/100
See application file for complete search history.

(56) References Cited

U.S. PATENT DOCUMENTS

| | | | |
|---|---|---|---|
| 4,995,001 A | 2/1991 | Dawson et al. | |
| 5,115,413 A | 5/1992 | Sato et al. | |
| 5,204,841 A | 4/1993 | Chappell et al. | |
| 5,319,603 A | 6/1994 | Watanabe et al. | |
| 5,646,893 A | 7/1997 | McMinn et al. | |
| 5,717,647 A | 2/1998 | Hush et al. | |
| 6,058,439 A | 5/2000 | Devereux | |
| 6,134,180 A | 10/2000 | Kim et al. | |
| 6,564,285 B1 | 5/2003 | Mills et al. | |
| 6,650,142 B1 * | 11/2003 | Agrawal et al. | 326/41 |
| 6,765,408 B2 * | 7/2004 | Cheng et al. | 326/41 |
| 7,092,279 B1 | 8/2006 | Sheppard | |
| 7,206,857 B1 | 4/2007 | Mammen et al. | |
| RE40,423 E | 7/2008 | Nance et al. | |
| 7,616,518 B2 | 11/2009 | Im et al. | |
| 8,089,813 B2 * | 1/2012 | Dreps | 365/185.2 |
| 8,296,581 B2 * | 10/2012 | Jennings et al. | 713/193 |
| 2003/0174569 A1 | 9/2003 | Amidi | |
| 2005/0018514 A1 | 1/2005 | Knaack et al. | |
| 2005/0024369 A1 | 2/2005 | Xie | |
| 2005/0033875 A1 | 2/2005 | Cheung et al. | |
| 2005/0177660 A1 | 8/2005 | Mamidwar et al. | |
| 2009/0083500 A1 | 3/2009 | Burchard et al. | |
| 2009/0100206 A1 | 4/2009 | Wang | |
| 2009/0100285 A1 | 4/2009 | Bae et al. | |
| 2009/0290436 A1 | 11/2009 | Hur et al. | |
| 2010/0198936 A1 | 8/2010 | Burchard et al. | |

OTHER PUBLICATIONS

Arrow Electronics, Arrow Innovation, Oct. 2003, Arrow NE Marcom Department/RESOURCE Design Communications Ltd.

(Continued)

*Primary Examiner* — Clifford Knoll

(57) ABSTRACT

An integrated circuit device may include a first integrated circuit (IC) portion having a single memory port to access at least one memory array, the single port including a first set of address, control and data paths; and a second IC portion comprising at least a first memory port and a second memory port for providing access to the memory locations of the first IC portion through the single port of the first IC portion.

20 Claims, 14 Drawing Sheets

(56) References Cited

OTHER PUBLICATIONS

Cypress Semiconductor Corporation, Data Sheet CY7C1303BV25/ CYC1306BV25, 18 Mbit Burst of Two Pipelined SRAM with QDR(R) Architecture, Aug. 25, 2009.

USPTO Advisory Action for U.S. Appl. No. 12/757,614 dated Oct. 25, 2012; 3 pages.
USPTO Final Rejection for U.S. Appl. No. 12/757,614 dated Aug. 20, 2012; 21 pages.
USPTO Non Final Rejection for U.S. Appl. No. 12/757,614 dated May 10, 2012; 18 pages.

\* cited by examiner

MULTI-PORT MEMORY DEVICES AND METHODS

This application claims the benefit of U.S. provisional patent application Ser. No. 61/158,676 filed on Mar. 9, 2009, the contents of which are incorporated by reference herein.

TECHNICAL FIELD

The present disclosure relates generally to integrated circuit devices, and more particularly to memory devices having multiple ports to access storage locations.

BRIEF DESCRIPTION OF THE DRAWINGS

FIGS. 3A to 3C-1 are a sequence of block schematic diagrams showing memory devices and methods according to further embodiments.

DETAILED DESCRIPTION

Figure 1:
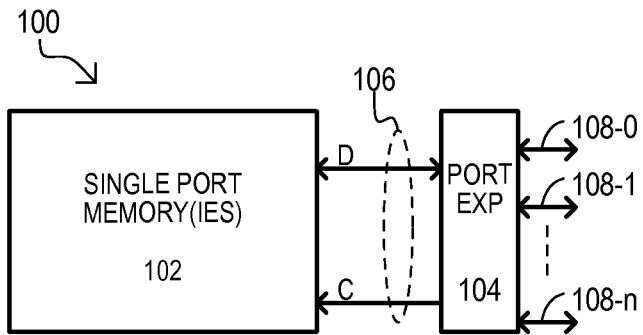
FIG. 1 is a block schematic diagram of a memory device according to a first embodiment.

Various embodiments will now be described that show multi-port memory devices and methods that include a single port memory integrated circuit portion connected to two or more memory ports by another integrated circuit portion. In the various embodiments shown herein, like sections may be referred to by the same reference characters, but with the leading digit(s) corresponding to the figure number.

Referring now to FIG. 1, an integrated circuit device according to a first embodiment is shown in a block schematic diagram and designated by the general reference character 100. A device 100 may include a single port memory (SPM) portion 102 and a port expansion portion 104 connected to one another over a single port connection 106.

An SPM portion 102 may include one or more SPM memory arrays accessed by one memory port. A memory port may include those signals necessary to access memory device for read and/or write operations. In one embodiment, a memory port may generally include control inputs (C) for determining a type, timing and location of an access operation (e.g., read or write, program or erase) and one or more data paths (D) for enabling data to be read from and/or written to the memory array(s). In a very particular embodiment, a control inputs may include command data signals, address signals, and timing (e.g., clock) signals.

An SPM memory portion 102 may differ from "true" dual port arrays in that arrays may not be accessed simultaneously by way of two different ports, but rather may be accessed sequentially by a single port. Consequently, an SPM memory portion 102 may be less complex than, occupy less area than, and be less costly to manufacture than a true dual-port memory circuit.

In some embodiments, an SPM memory portion 102 may include memory arrays based all or in part on any of various memory technologies, including but not limited to: dynamic random access memories (DRAMs), static RAMs (SRAMs), "pseudo" SRAMs (e.g., memories with DRAM based cores and SRAM type interfaces), or electrically erasable and programmable read-only-memories (EEPROMs), such and NAND type flash memories and/or NOR type memories.

Single port connection 106 may be a parallel port connection, or alternatively, a serial port connection.

A port expansion portion 104 may include two or more memory ports 108-0 to -n. Each memory port (108-0 to -n) may serve as a data access "pipe" for another device to access storage locations within SPM portion 102 of memory device. As such, each port (108-0 to -n) may receive signals for accessing memory locations within SPM portion 102 by way of single port connection 106, and may also output data from SPM portion 102 to any of ports (108-0 to -n). A port expansion portion 104 may include multi-port access logic that may transform or forward requests at any of various ports (108-0 to -n) into ordered accesses to SPM portion 102.

In particular embodiments, such multi-port access may be random access logic that allows requests from various ports to be serviced in a random order.

In other embodiments, a port expansion portion 104 may include first-in-first-out (FIFO) logic that may process accesses from multiple ports in first-in-first-out fashion (with respect to port inputs). In such embodiments, requests from multiple ports may be ordered within a port expansion portion and applied in a sequential order to SPM portion 102. In a similar fashion, data may be output from SPM portion 102 in a sequential fashion and then forwarded to an appropriate port (108-0 to -n).

As will be described in more detail below, in some embodiments, all or a portion of a port expansion portion 104 may be formed with programmable circuits that are programmed with configuration values to provide communication paths between ports (108-0 to -n) and a single port of SPM portion 102. Further, in some embodiments, all or a portion of a port expansion portion 104 may be formed in a same substrate as SPM portion 102. Alternatively, SPM portion 102 and port expansion portion 104 may be separate integrated circuit devices connected to one another in a single integrated circuit package.

In this way, an integrated circuit device may include a first IC portion having an SPM and a second IC portion that enables any of multiple ports to access the SPM.

Figure 2A:
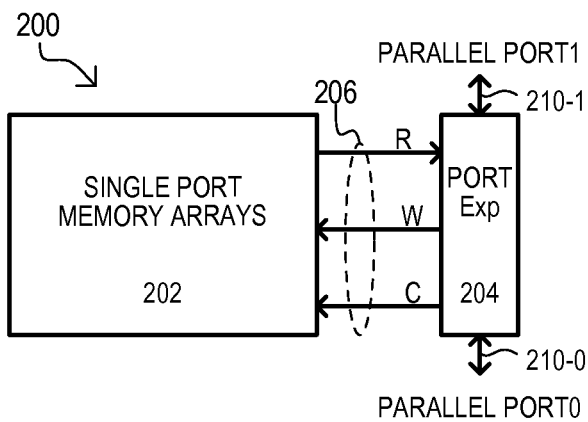
FIGS. 2A and 2B are block schematic diagrams of memory devices according to other embodiments.
Figure 2B:
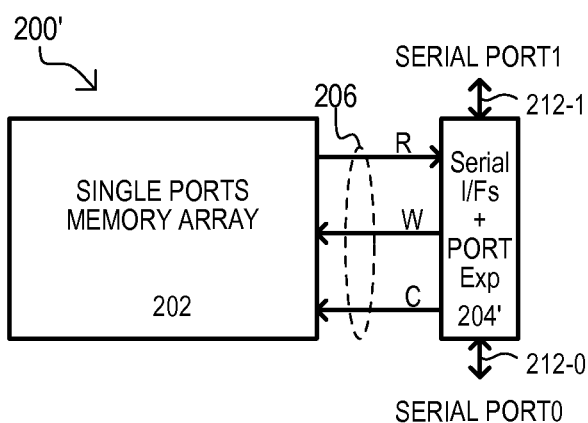

Referring to FIGS. 2A and 2B, very particular embodiments of a dual-port memory device (DPM) are shown in block schematic diagrams. The embodiments of FIGS. 2A and 2B may be very particular implementations of that shown in FIG. 1.

Referring to FIG. 2A, a DPM device is shown in a block schematic diagram and designated by the general reference character 200. A DPM 200 may include a single port connection 206 having a data path (D) divided into a read data path (R) that may output data from an SPM portion 202, as well as a write data path (W) that may receive data from a port expansion portion 204.

In addition, a port expansion portion 204 may include a first parallel port (PORT0) 210-0 and a second parallel port (PORT1) 210-1 that may be connected to single port connection 206 by FIFO logic. Parallel ports (210-0/1) may provide control and data paths where multi-bit data values are transmitted in parallel. For example, in a read operation multi-bit address and command data may be received in parallel (in one or more sets), on input on signal lines. Subsequently, read data may be output in parallel on signal lines. In a write operation, multi-bit address, command data, and write data may be received in parallel (in one or more sets) on input on signal lines. In particular embodiments, address and data values may be multiplexed, with address values being applied at a different time than corresponding data values.

It is understood that parallel ports (PORT0 and PORT1) may be different types of parallel ports. Different parallel ports may include, without limitation, DRAM type interfaces (e.g., DDR, DDR2, DDR3), SRAM interfaces, or flash memory interfaces.

Referring to FIG. 2B, another DPM device is shown in a block schematic diagram and designated by the general reference character 200'. A DPM device 200' may include sections like those of FIG. 2A, however, unlike FIG. 2A, a port expansion portion 204' may include a first serial port (PORT0) 212-0 and a second serial port (PORT1) 212-1 which may be connected to single port connection 206 by FIFO logic. Serial ports (212-0/1) may provide control and data paths where multi-bit data values are transmitted in a serial manner. For example, in a read operation either of a multi-bit address and command data value may be received in a serial fashion on one or more signal lines. Subsequently, read data may be output in serial fashion on one or more signal lines. In a like fashion, in a write operation, multi-bit address, command data, and write data may be received in a serial fashion on one or more input signal lines.

As in the case of FIG. 2A, in FIG. 2B serial ports (PORT0 and PORT1) may be different types of serial ports. Different serial ports may include, without limitation, PCI Express, RapidIO, USB, Serial ATA (SATA) or IEEE 1394 interface (Firewire).

Parallel ports (210-0/1) and/or serial ports (212-0/1) may have input write data lines separate from output read data lines, or may include data input/output (I/O) lines for both read and write data.

While FIG. 2A shows only parallel ports and FIG. 2B shows only serial ports, other embodiments may include one or more parallel ports in conjunction with one or more serial ports.

In this way, a SPM memory may be accessed by any of multiple parallel ports and/or serial ports.

Referring now to FIGS. 3A to 3C-1, programmable multi-port memory devices and methods according to other embodiments are shown in a series of block schematic diagrams.

Figure 3A:
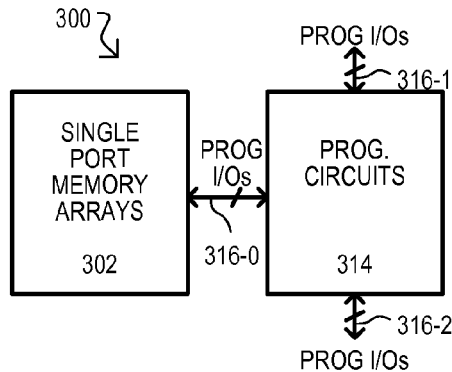

Referring to FIG. 3A, a memory device is shown in a block schematic diagram and designated by the general reference character 300. A device 300 may include an SPM portion 302 and a programmable circuit portion 314. An SPM portion 302 may have features of SPM portions described in other embodiments herein, and equivalents.

A programmable circuit portion 314 may include programmable circuits that may be configured into various functions based on configuration data. In some embodiments, a programmable circuit portion 314 may include circuits that are capable of being reconfigured many times. Such circuits may include volatile storage circuits that are loaded with configuration data (from a nonvolatile memory) for example, to thereby be programmed to a particular configuration. Alternatively, programmable circuit portion 314 may include one-time programmable elements (e.g., anti-fuse) for establishing a desired function. Still further, as a will be shown in other embodiments below, programmable circuit portion 314 may include one or more non-programmable circuit blocks with set functions in addition to programmable circuits. In some embodiments, all or a portion of a programmable circuit portion 314 may be formed in a same substrate as SPM portion 302. Alternatively, SPM portion 302 and programmable circuit portion 314 may be separate integrated circuit devices connected to one another in a single integrated circuit package.

Referring still to FIG. 3A, in the embodiment shown, a programmable circuit portion 314 may include a number of programmable input/output (I/O) lines 316-0 to 316-2. Programmable I/O lines 316-0 may be connected to SPM portion 302 (and after a programming step may form a single port connection 306).

Figure 3B:
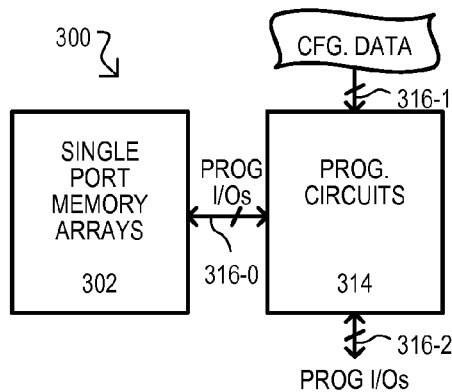

Referring now to FIG. 3B, a programmable circuit portion 314 may receive configuration data (CFG. DATA). Such configuration data may establish a function of programmable circuits within portion 314.

Figures 0, 1, 3C:
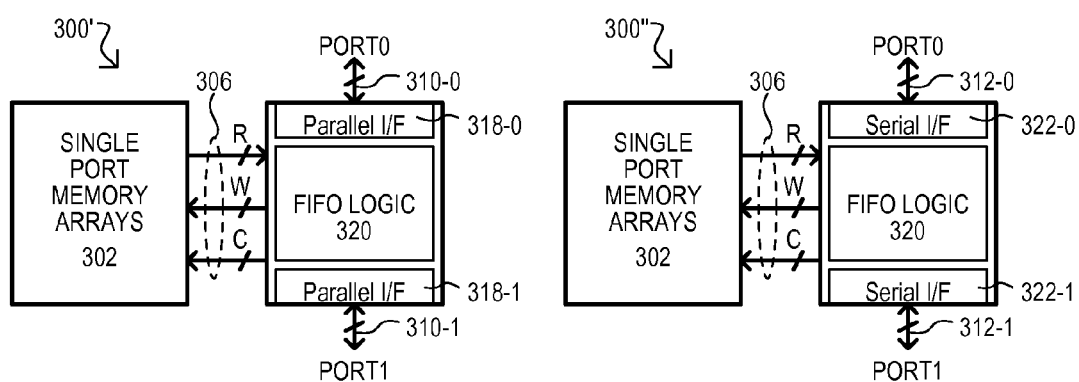

FIG. 3C-0 shows a first programmed embodiment of device 300 after a programmable circuit portion 314 has been configured in response to one set of configuration data. As shown in the figure, programmable circuit portion 314 may be configured to include a first parallel interface (I/F) 318-0, a second parallel interface (I/F) 318-1, and FIFO logic 320. With parallel interfaces 318-0/1 created, programmable I/Os 316-1 form part of a first parallel port PORT0 while programmable I/Os 316-2 form part of a second parallel port. In addition, FIFO logic 320 may result in programmable I/Os 316-1 forming a single port connection 306. The programmed device of FIG. 3C-0 may be one version of that shown in FIGS. 1 and/or 2A.

FIG. 3C-1 shows a second programmed embodiment of device 300 after a programmable circuit portion 314 has been configured in an alternative way in response to another set of configuration data. As shown in the figure, programmable circuit portion 314 may be configured to include a first serial I/F 322-0, a second serial I/F 322-1, and FIFO logic 320. Consequently, programmable I/Os 316-0, -1, and -2 may form parts of a single port connection 306, first serial port PORT0 312-0, and second serial port 312-1, respectively. The programmed device of FIG. 3C-1 may be one version of that shown in FIGS. 1 and/or 2B.

While the embodiments of FIGS. 3C-0 and 3C-1 show programmable circuit portion 314 configured to include two ports to access SPM portion 302, other embodiments may include more ports for accessing a same single port section. Further, while FIGS. 3C-0 and 3C-1 show FIFO logic 320 other embodiments may have different kind of logic for forwarding requests to SPM portion 302.

In this way, a multi-port memory device may include programmable circuits that may be programmed to form two or more ports for accessing a single port device. Such programmability may enable one device to be deployed that can accommodate multiple different port specifications by allowing the device to be programmed to meet such specifications. Thus, a programmable circuit portion to provide a flexible interface to accommodate various applications.

While the embodiments of FIGS. 3A to 3C-1 show a programmable circuit portion in which various sections of a port expansion section are created with programmable circuits, in other embodiments, a programmable circuit portion may include circuit blocks with predetermined functions that are substantially not programmable. Such embodiments will be described with reference to FIGS. 4A to 5B.

Figure 4A:
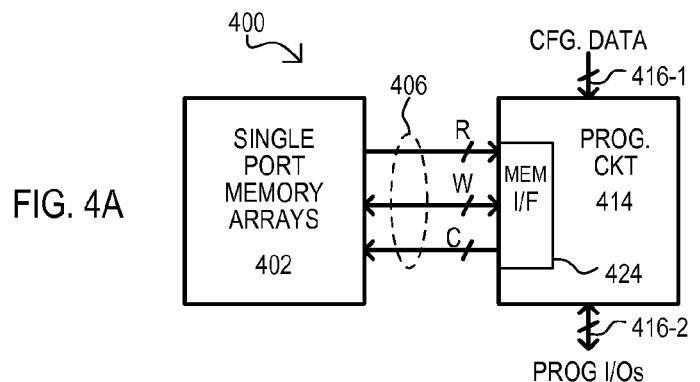
FIGS. 4A and 4B are block schematic diagrams showing a memory device and method according to yet other embodiments.

Referring to FIG. 4A, a memory device is shown in a block schematic diagram and designated by the general reference character 400. A device 400 may include an SPM portion 402 and a programmable circuit portion 414, like the embodiment shown in FIG. 3A. However, unlike FIG. 3A, programmable circuit portion 414 may include a prefabricated section 424, which in this case is a memory I/F that may communicate with SPM portion 402 along single port connection 406. That is, programmable portion 414 is manufactured with a memory interface 424, thus such all or a portion of such a feature does not necessarily have to be created with programmable circuits.

Figure 4B:
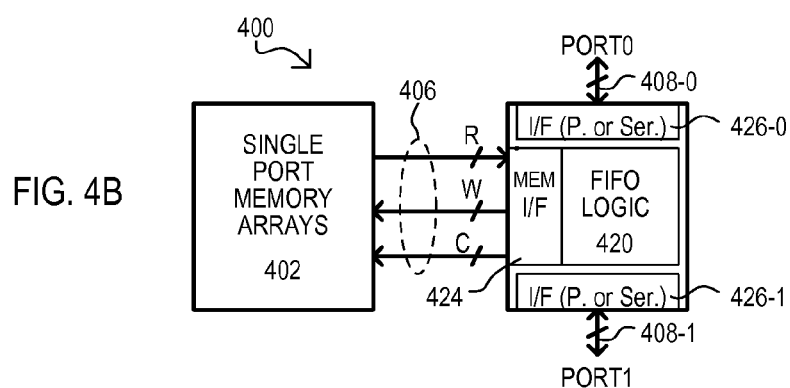

FIG. 4B shows device 400 after a programmable circuit portion 414 has been configured in response to configuration data. As shown in the figure, programmable circuit portion 414 has been configured to include a first I/F 426-0, a second I/F 426-1, and FIFO logic 420. Interfaces 426-0/1 may be parallel or serial interfaces that form memory ports 408-0/1. The programmed device of FIG. 4B may be one version of that shown in any of FIGS. 1 to 2B.

Figure 5A:
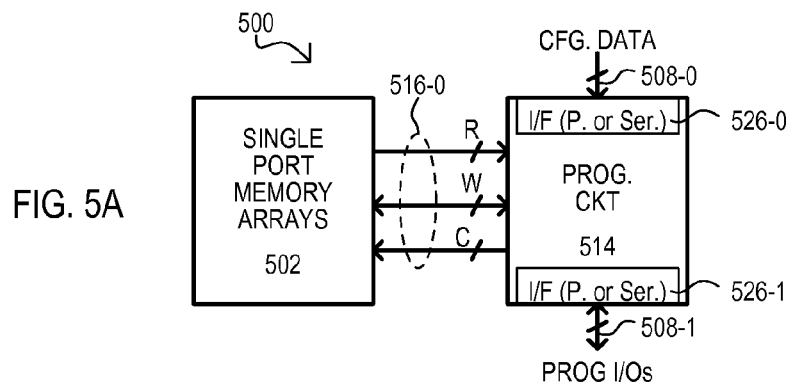
FIGS. 5A and 5B are block schematic diagrams showing a memory device and method according to other embodiments.

Referring to FIG. 5A, a memory device is shown in a block schematic diagram and designated by the general reference character 500. A device 500 may include an SPM portion 502 and a programmable circuit portion 514. Programmable circuit portion 514 may also include prefabricated sections 526-0 and -1, which in this case may be interfaces (I/F) that provide ports (508-0/1) for accessing SPM portion 502. Interfaces (I/F) may be parallel or serial interfaces.

Figure 5B:
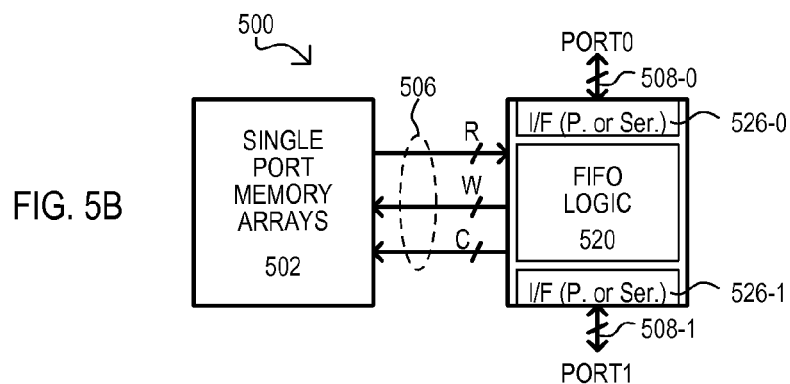

FIG. 5B shows device 500 after a programmable circuit portion 514 has been configured in response to configuration data. As shown in the figure, programmable circuit portion 514 has been programmed to include FIFO logic 520 that may allow access to SPM portion 502 by way of ports 508-0/1.

In this way, a multi-port memory device may include programmable circuits that may be programmed to form two or more ports for accessing a single port device, where such programmable circuits may include sections with prefabricated circuits that are not substantially programmable. The programmed device of FIG. 5B may be one version of any of those shown in FIGS. 1 to 2B.

A memory device according to embodiments may include an SPM portion and a port expansion portion, which may be programmable, partially programmable or substantially not programmable. In some embodiments, such different portions may be formed in a same integrated circuit substrate, as shown in FIGS. 6A to 6D.

Figure 6A:
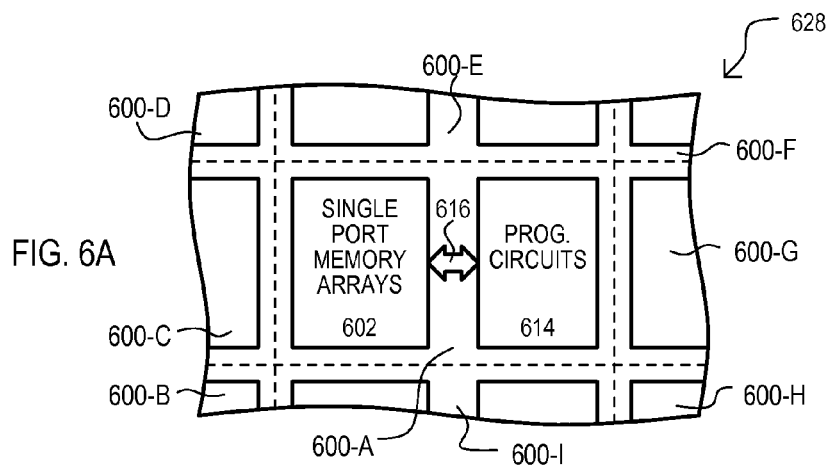
FIGS. 6A to 6D are a series of top plan views showing memory devices and methods according to embodiments.

Referring to FIG. 6A, memory devices 600-A to -I may be formed in a manufacturing substrate 628 (memory devices 600-B to -I only shown in part). Each memory device (600-A to -I) may include an SPM portion 602 and a programmable circuit portion 614 such as those described in the embodiments herein, or equivalents. Accordingly, an SPM portion 602 may be conceptualized as being embedded with a programmable circuit 614, or vice versa.

In one embodiment, a substrate 628 may be a semiconductor substrate. In a particular embodiment, a substrate may be a semiconductor wafer and portions 602 and 614 may be fabricated with integrated circuit manufacturing techniques.

Figure 6B:
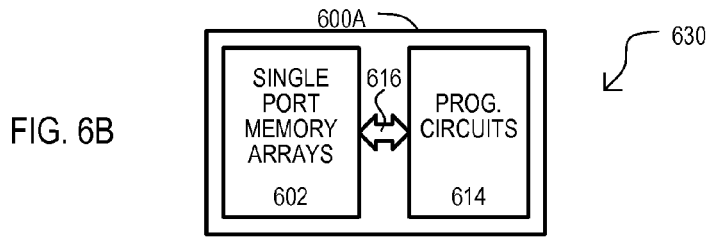

Referring to FIG. 6B, a manufacturing substrate 628 may be divided into individual device substrates (one shown as 630). In one embodiment, a wafer may be cut into individual dice (e.g., 630). Thus, each die has integrated on it both an SPM portion 602 and a programmable circuit portion 614.

Figure 6C:
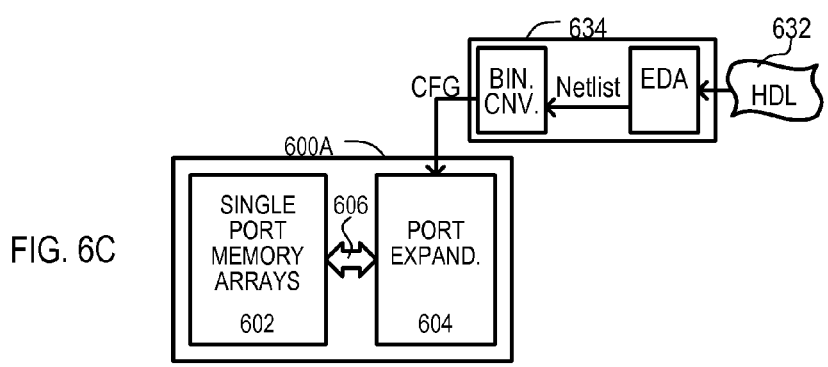

Referring to FIG. 6C, design data (HDL) 632 may be created for a particular port configuration that is compatible with programmable circuit portion 614. Such design data 632 may be converted to configuration data (CFG) suitable for programmable circuit portion 614 by a data converter 634. As a result, programmable circuit portion 614 may be programmed to provide multiple ports for accessing SPM portion 602. In very particular embodiments, a programmable circuit portion 614 may be programmed as shown in 3A to 3B.

While devices may be fabricated with a programmable portion that is configured with design data to provide multiple ports to a single port memory architecture, the same design data may be utilized to fabricate a substantially non-programmable port expansion portion. Such an embodiment is shown in FIG. 6D.

Figure 6D:
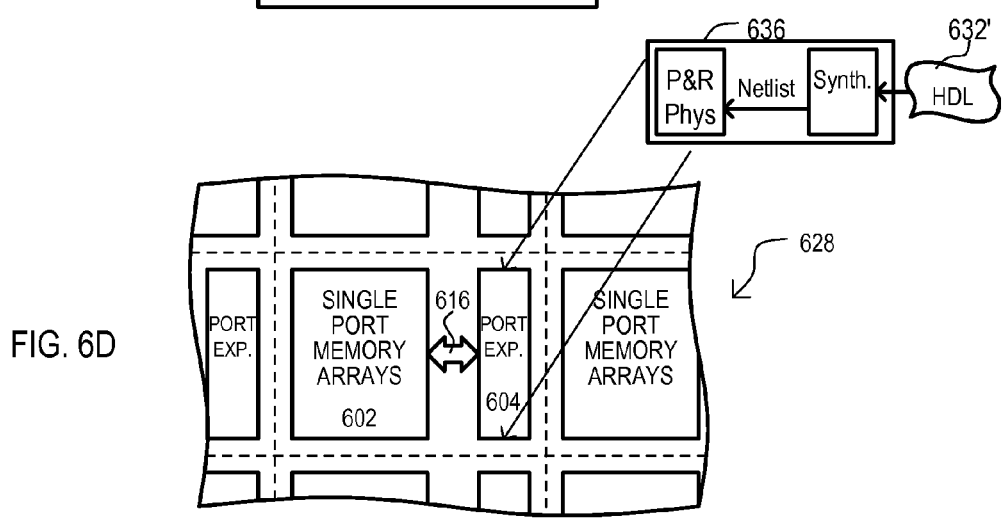

Referring to FIG. 6D, design data (HDL) 632' may be created for a particular port configuration that is compatible with programmable circuit portion 614. Such design data 632' may be converted into a physical design by a design tool 636. Physical design data may include the physical circuit layout (e.g., mask layers) for creating a port expansion portion. Such a physical design may create a port expansion portion 604 with SPM portion 602 to create a substantially non-programmable multi-port device. In particular embodiments, a port expansion portion 604 may be a logic "sliver" (e.g., relatively small portion of a semiconductor substrate) that may be added to an existing SPM portion 602 design.

Referring to FIGS. 6C and 6D, in some embodiments, design data 632' may be the same as that shown as 632 in FIG. 6C. For example, while an initial manufacturing of a memory product may occur as shown in FIG. 6C, if demand reaches a predetermined level, a device having the same functionality may be created as shown in FIG. 6D. In such an embodiment, a port expansion portion formed with the physical design may be substantially smaller than a programmable circuit portion 614.

In very particular embodiments, a device like that of FIG. 6C may be one version of any of those shown in FIGS. 1 to 5B. Further, a device like that of FIG. 6D may be one version of that shown in any of FIG. 1, 2A or 2B.

In this way, a memory device may have a single port memory portion and a port expansion portion formed in a same substrate.

While the embodiments of FIGS. 6A to 6D show a memory device in which an SPM portion and a port expansion portion may be formed in a same integrated circuit (IC) substrate, other embodiments may include such portions being formed in different IC substrates. One such embodiment is shown in FIGS. 7A to 7D.

Figure 7A:
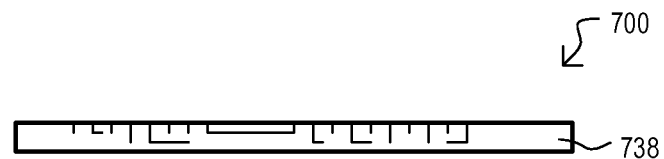
FIGS. 7A to 7D are a sequence of side cross sectional views showing a memory device and method according to yet another embodiment.

Referring to FIG. 7A, a memory device 700 may include a multi-die IC package structure 738. A package structure 738 may provide conductive connections between multiple IC devices (e.g., dice) as well as other circuit elements such as passive circuit elements. In addition, a package structure 738 may also provide input and output connections for communicating with other devices of a larger system. In the embodiment shown, a package structure 738 may be multi-chip circuit board structure that allows connections to IC dice on one side, and package connections on another. However, other embodiments may include other device orientations, such as vertical dice stacking, including dice connected by vertical through vias and/or aligned pad locations.

Figure 7B:
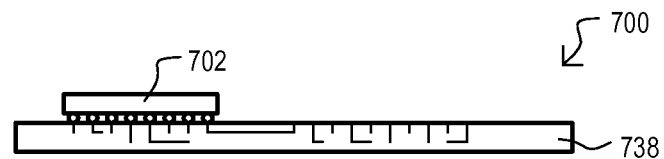

Referring to FIG. 7B, a first IC substrate may be connected to package structure 738. In the embodiment shown, such a first IC substrate may be an SPM portion 702. An SPM portion 702 may have a structure like that described in other embodiments, and equivalents.

Figure 7C:
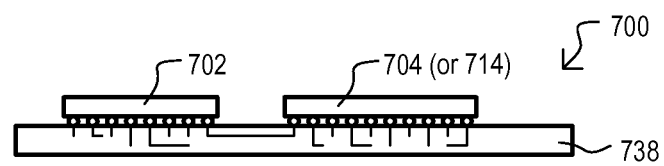

Referring to FIG. 7C, a second IC substrate may be connected to package structure 738. In the embodiment shown, such a second IC substrate may be a port expansion portion 704. In some embodiments, such a port expansion portion may be a programmable circuit portion 714 that is programmed to provide multi-port access to SPM portion 702, or may be programmed (or reprogrammed) at a later point to provide such function.

Figure 7D:
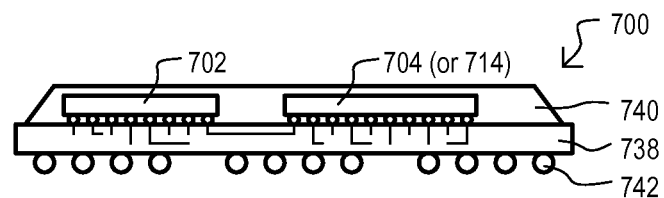

Referring to FIG. 7D, a protection structure 740 may be formed over SPM portion 702 and port expansion portion 704. Further external package connections (one shown as 742) may be finalized to form a memory device 700. A memory device 700 may thus form a "system-in-package" (SIP) that includes SPM portion and port expansion portion (or programmable circuits to form a port expansion portion).

In particular embodiments, a memory device 700 may be one implementation of those shown in any of FIGS. 1 to 5B.

In this way, a memory device may have a single port memory portion and a port expansion portion formed in different substrates and assembled into a same integrated circuit package.

Figure 8:
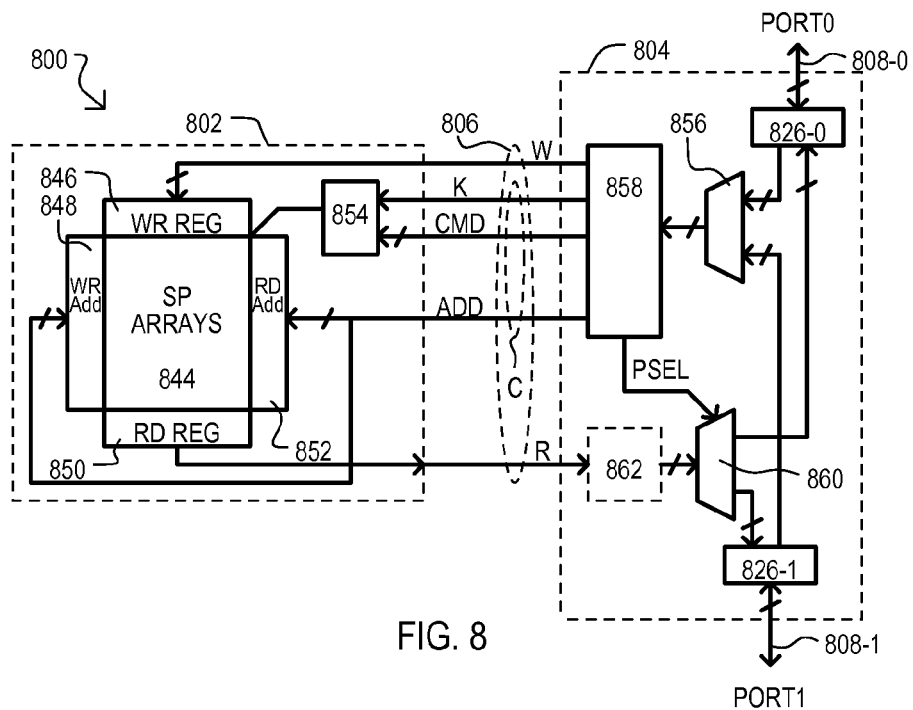
FIG. 8 is a block schematic diagram of a memory device according to an embodiment.

Referring to FIG. 8, a very particular embodiment of a memory device is shown in a block schematic diagram and designated by the general reference character 800. A memory device 800 may include a DPM portion 802 and a port expansion portion 804. A memory device 800 may include single port memory (SPM) arrays 844, a write data register 846, a write address decoder 848, a read data register 850, a read address decoder 852, and a timing and control circuit 854. SPM arrays 844 may include storage locations to store data received in write operations, and output stored data in read operations. SPM arrays 844 may be accessible for read and write operations in a sequential fashion. In particular embodiments, SPM arrays 844 may be volatile memory arrays, even more particularly, static random access memory (SRAM) arrays.

A write data register 846 may store write data received on a write data bus (W) that is to be stored within one of single port memory arrays 844. A write address decoder 848 may receive a write address on address lines (ADD), and decode such an address to determine where write data is to be stored within SPM arrays 844. Similarly, a read address decoder 852 may receive a read address on address lines (ADD), and decode such an address to determine from where read data is to be output. Read data register 850 may store read data output from SPM arrays 844, and provide such data on read data bus (R).

A timing and control circuit 854 may receive command data (CMD) indicating a type of operation (e.g., read or write) as well as timing signals (K) for controlling the timing of operations executed by SPM portion 802.

In one particular embodiment, an SPM portion 802 may have an architecture of a QDR™ Synchronous SRAM like those manufactured by Cypress Semiconductor Corporation having offices in San Jose, Calif., U.S.A. In a very particular embodiment, an SPM portion 802 may be a QDR™ Synchronous SRAM in die form.

In the embodiment of FIG. 8, a SPM portion 802 may be connected to a port expansion portion 804 by a single port connection 806 that includes a write data input (W), a read data output (R), and a control input (C) that may include timing signals (K), command data (CMD), and address values (ADD).

Referring still to FIG. 8, a port expansion portion 804 may include a first I/F circuit 826-0, a second I/F circuit 826-1, a FIFO input path 856, a port control circuit 858, an output multiplexer (MUX) circuit 860, and optionally, an output translation circuit 862. First and second I/F circuits 826-0/1 may be parallel and/or serial interfaces according to embodiments described herein, and equivalents. Such I/F circuits 826-0/1 may provide separate ports 808-0/1 for accessing SPM portion 802.

FIFO input path 856 may be connected to first and second I/F circuits 826-0/1, and receive port access requests from such I/F circuits. Such access requests may include control data (e.g., address data, command data, and optionally timing signals) and input write data. A FIFO input path 856 may order such requests in a first-in-first-out fashion, to provide a sequence of requests to SPM portion 802 (through port control circuit 858). Accordingly, in particular embodiments, if two requests are received substantially simultaneously, FIFO input path 856 will order such requests in a sequential fashion according to predetermined criteria. Further, FIFO input path 856 may receive and/or determine port origination information for a port control circuit that indicates from which port (e.g., 808-0 or -1) a request (in particular a read request) originates.

A port control circuit 858 may receive sequences of requests from FIFO input path 856, and generate memory control signals suitable to SPM portion 802 to execute such requests. In addition, a port control circuit 858 may provide port select signals PSEL to FIFO output path 860 based on port origin information. Such an arrangement may ensure output data (e.g., read data) is output to the port originating the corresponding read request. In some embodiments, a port control circuit 858 may include command translation circuits in the event signals received at a port (e.g., 808-0/1) are not compatible with an architecture of SPM portion 802. In particular embodiments, a port control circuit 858 may be a circuit created with programmable circuits, thus a device 800 may accommodate various memory request formats.

Output MUX circuit 860 may have outputs connected to first and second I/F circuits 826-0/1 and receive output data from SPM portion 802. Based on port selection information (PSEL), output MUX circuit 860 may output data to a designated port (e.g., 808-0 or -1).

Optional output translation circuit 862 may receive data output from SPM portion 802 and translate it into a different format in the event devices at the ports 808-0/1 expect a different data format than that provided by SPM portion 802. As in the case of port control circuit 858, in particular embodiments, an output translation circuit 862 may be a circuit created with programmable circuits, thus a device 800 may accommodate various data format types.

In very particular embodiments, a memory device 800 may be one version of any of those shown in FIGS. 1 to 7D.

In this way, a memory device may include an SPM portion having separate read and write data buses, as well as separate read and write address decoders that receive address values from a same address bus.

Figure 9:
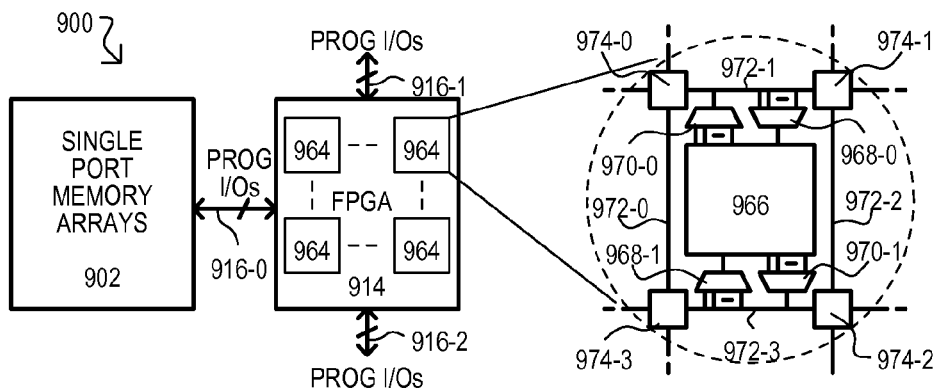
FIG. 9 is a block schematic diagram of a memory device according to a further embodiment.

Referring to FIG. 9, another very particular embodiment of a memory device is shown in a block schematic diagram and designated by the general reference character 900. A memory device 900 may include a SPM portion 902 and a programmable circuit portion 914. An SPM portion 902 may take the form of SPM portions shown in other embodiments herein, and equivalents.

A programmable circuit portion 914 may have programmable I/Os 916-0 that are connected or connectable to SPM portion 902, as well as programmable I/Os 916-1/2 that may serve as port I/Os in a programmed device. All or a portion of programmable circuit portion 914 may have a field programmable gate array (FPGA) type architecture, including a number of programmable sectors 964.

A programmable sector 964 for inclusion in the embodiments is shown in circle in FIG. 9. In the embodiment shown, programmable sector 964 may include a programmable core 966, programmable input MUXs 968-0/1, programmable output de-MUXs 970-0/1, data lanes 972-0 to -3, and programmable switch sections 974-0 to -3. A programmable core 966 may provide selectable logic functions according to configuration data, and may include programmable logic circuits, as but one example.

Data lanes 972-0 to -3 may include multiple signal lines, and collectively, may interconnect multiple programmable sectors 964 with one another. Programmable input MUXs 968-0/1 may selectively connect signals lines from data lanes 972-1/3 to inputs of programmable core 966 based on configuration data. Similarly, programmable output de-MUXs 970-0/1 may selectively connect outputs from programmable core 966 to signals lines of data lanes 972-1/3 based on configuration data. Switch sections 974-0 to -3 may selective connect signals of data lines to one another based on configuration information. An FPGA like architecture may enable the creation of re-configurable port expansion circuits having high data throughput rates, while allowing for flexibility in designs.

In very particular embodiments, a memory device 900 may be one version of any of those shown in FIGS. 1 to 6C and 7A to 8.

In this way, a memory device may include an SPM portion and a programmable circuit portion with an FPGA type architecture that may be programmed into a port expansion portion.

While some embodiments shown herein may include port expansion portions that allow two ports to access an SPM portion, other embodiments may include more than two ports. One particular embodiment having more than two ports is shown in FIG. 10.

Figure 10:
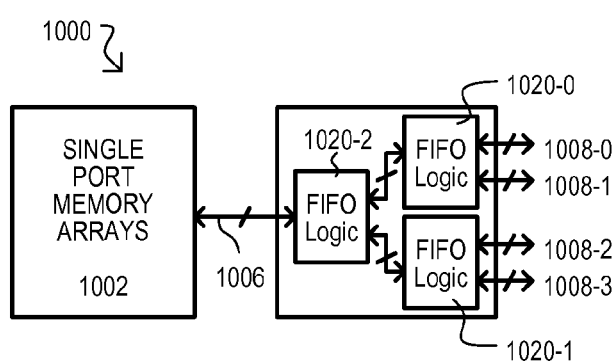
FIG. 10 is a block schematic diagram of a memory device according to yet another embodiment.

Referring to FIG. 10, an embodiment of a memory device is shown in a block schematic diagram and designated by the general reference character 1000. A memory device 1000 may include a SPM portion 1002 and a port expansion portion 1004. An SPM portion 902 may take the form of SPM portions shown in other embodiments herein, and equivalents.

A port expansion portion 1004 may include multiple FIFO logic sections to order requests from more than two ports. In the embodiment shown, port expansion portion 1004 may include three FIFO logic sections 1020-0 to -2 to enable requests to be sequentially ordered from four ports (PORT0 to PORT3) 1008-0 to -3 prior to being applied to SPM portion 1002. In more detail, a FIFO logic section 1020-0 may sequence requests from ports 1008-0/1 (PORT0 and PORT1). FIFO logic section 1020-1 may sequence requests from ports 1008-2/3 (PORT2 and PORT3). FIFO logic section 1020-2 may sequence requests output from the other FIFO logic sections 1020-0/1. Memory device of FIG. 10 may be one particular implementation of that shown in FIG. 1.

In this way, a memory device may include a port expansion portion with more than two ports that order requests form such ports with FIFO logic sections.

While embodiments of the invention may include circuits for enabling multi-port communication with an SPM portion, other embodiments may additionally include processing of data stored by an SPM portion. Two such embodiments will now be described with reference to FIGS. 11A and 11B.

Figure 11A:
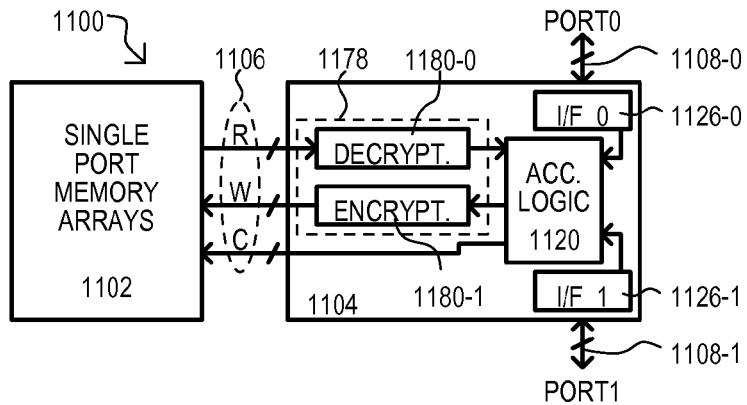
FIGS. 11A and 11B are block schematic diagrams of memory devices according to additional embodiments.
Figure 11B:
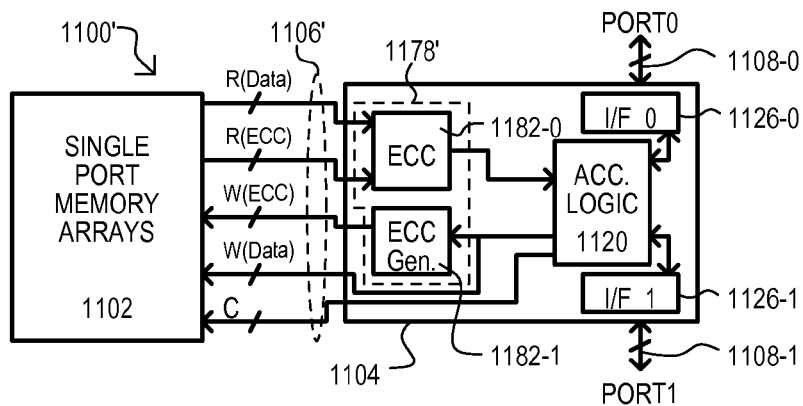

Referring now to FIGS. 11A and 11B, memory devices according to further embodiments are shown in block schematic diagrams and designated by the general reference characters 1100 and 1100', respectively. Memory device 1100 and 1100' may each include an SPM portion 1102 and a port expansion portion 1104. An SPM portion 1102 may take the form of SPM portions shown in other embodiments herein, and equivalents.

Port expansion portions 1104 and 1104' may include I/F circuits 1126-0/1 and access logic 1120. Such items may take the form of those shown in other embodiments, or equivalents. However, port expansion portions 1104 and 1104' may also include data processing sections 1178 and 1178'.

Referring to FIG. 11A, a data processing section 1178 of memory device 1100 may include an encryption circuit 1180-0 and a decryption circuit 1180-1. An encryption circuit 1180-0 may encrypt write data prior to such data being written into SPM portion 1102. A decryption circuit 1180-1 may decrypt read data prior to such data being output from SPM portion 1102.

In a particular embodiment, data processing section 1178 may be formed with programmable circuits, thus enabling different encryption/decryption schemes to be implemented according to application.

Referring to FIG. 11B, a data processing section 1178' of memory device 1100' may include error correction circuits. In particular, an error code generation circuit 1182-1 may generate error correction codes (ECC) from received write data, and allow such codes to be stored with corresponding write data within SPM portion 1102. In addition, a error check and correction circuit 1182-0 may receive read data values and corresponding ECC values from SPM portion, and check (and correct, if necessary) read data values prior to such data values being output from a port (e.g., 1108-0 or -1).

It is noted that the error correction configuration like that shown in FIG. 11B may also be implemented in the opposite data direction. That is, write data with corresponding ECC values may arrive from a port (e.g., 1108-0 or -1). An error check and correction circuit may receive such write data values and corresponding ECC values and check (and correct, if necessary) the write data prior to such data values being written into an SPM portion. In addition, an error code generation circuit may generate error correction codes (ECC) from read data output from SPM portion, and provide the read data and ECC values on a port.

In a particular embodiment, data processing section 1178' may be formed with programmable circuits, thus enabling different error check and/or correction schemes to be implemented according to application.

While embodiments of the invention may include circuits for enabling multi-port communication with an SPM portion, other embodiments may additionally include circuits that control how (or if) an SPM portion is accessed via any of multiple ports. Two such embodiments will now be described with reference to FIGS. 12A and 12B.

Figure 12A:
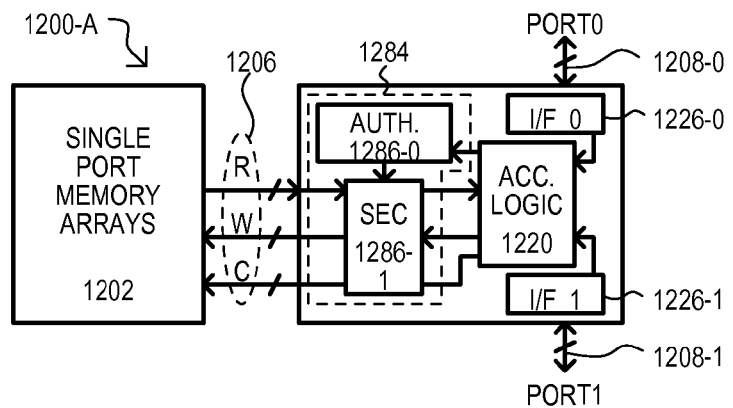
FIGS. 12A to 12C are block schematic diagrams of memory devices according to other embodiments.
Figure 12B:
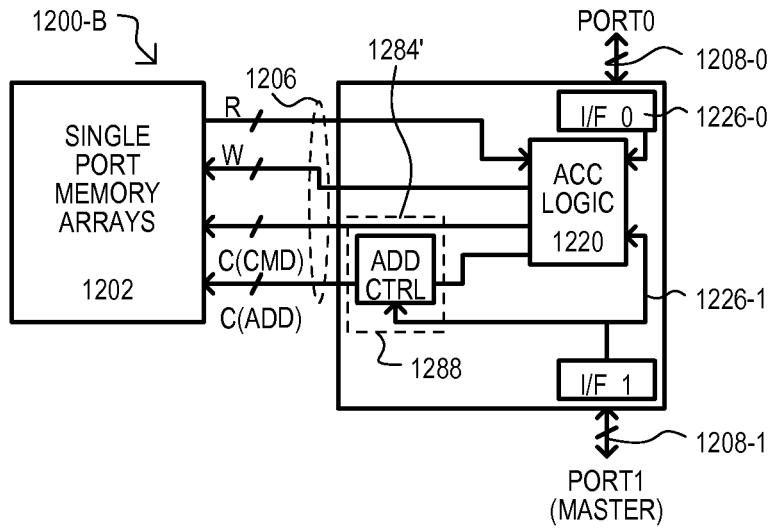
Figure 12C:
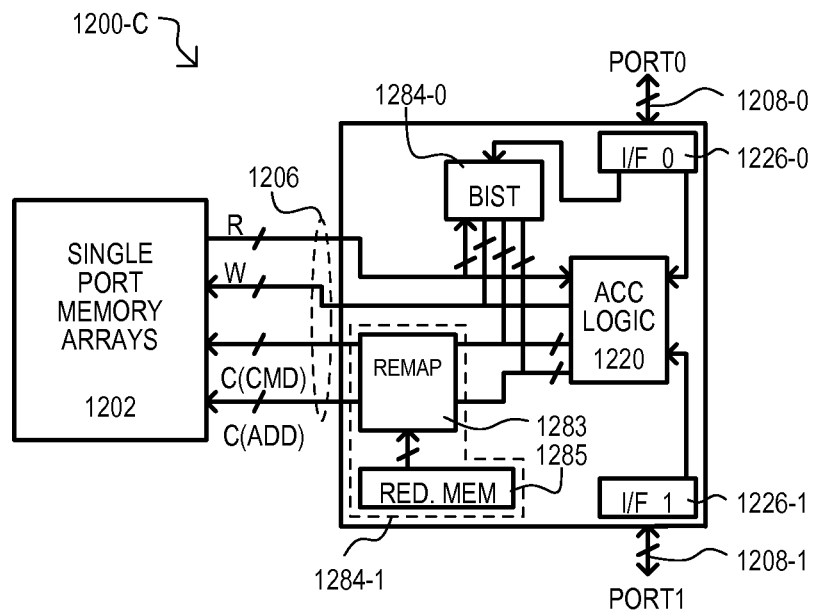

Referring now to FIGS. 12A to 12C, memory devices according to further embodiments are shown in block schematic diagrams and designated by the general reference characters 1200-A to 1200-C, respectively. Memory devices 1200-A to 1200-C may each include an SPM portion 1202 and a port expansion portion 1204. An SPM portion 1202 may take the form of SPM portions shown in other embodiments herein, and equivalents. Port expansion portions 1204 and 1204' may include I/F circuits 1226-0/1 and access logic 1220 as shown in other embodiments, or equivalents. Port expansion portions 1204 and 1204' may also include data access sections 1284, 1284' 1284-0 and/or 1284-1.

Referring to FIG. 12A, a data access section 1284 of memory device 1200 may include an authentication circuit 1286-0 and secure access path 1286-1. In one embodiment, an authentication circuit 1286-0 may execute an authentication operation on predetermined data with a secure key, or the like, and compare such an authentication result to a received authentication value from a device external to memory device 1200. If such values match, authentication circuit 1286-0 may enable secure access path 1286-1, thereby enabling accesses to SPM portion 1202. However, if authentication values do not match, authentication circuit 1286-0 may disable secure access path 1286-1, thereby preventing accesses to SPM portion 1202.

In a particular embodiment, data access section 1284 may be formed with programmable circuits, thus enabling different authentication schemes to be implemented according to application.

Referring to FIG. 12B, a data access section 1284' of memory device 1200' may include an address control circuit 1288. An address control circuit 1288 may logically partition areas of SPM portion 1202. In the embodiment shown, command and address data received from a port (e.g., 1208-0/1) may be altered by address control circuit 1288 to direct accesses to SPM locations. Further, an address control circuit 1288 may accessed through a "master" port (in this embodiment PORT1) to be placed in a particular configuration. According to such a configuration, port accesses may be restricted, including being unable to access particular sections of SPM portion 1202, or only being able to perform certain operations (e.g., reads and not writes) at particular locations within SPM portion 1202.

In a particular embodiment, data access section 1284' may be formed with programmable circuits, thus enabling different partitioning schemes to be implemented according to application. Referring to FIG. 12C, a data access section 1284 of memory device 1200 may include a built-in-self-test (BIST) circuit 1284-0 and/or a redundancy circuit 1284-1. A BIST circuit 1284-0 may execute self-test operations on SPM section 1202 over single port connection 1202. In the embodiment shown, BIST circuit 1284-0 may also be accessed over port 1208-0. In a very particular embodiment, a BIST circuit 1284-0 may write data into locations of SPM portion 1202 according test patterns, and then read such data and compare it to expected data values. Results of such tests may be output over 1208-0.

A redundancy circuit 1284-1 may include a remapping circuit 1283 and a redundancy memory 1285. A remapping circuit 1283 may compare a received address to known addresses of defective locations indicated by redundancy memory 1285, and access a redundant location instead of the defective location.

In a particular embodiment, data access sections 1284-0 and/or 1284-1 may be formed with programmable circuits, thus enabling different BIST or redundancy schemes to be implemented according to application.

In particular embodiments, the memory devices of FIGS. 11A to 12C may particular implementations of those shown in FIGS. 1A to 9. It is noted that the particular embodiments of FIGS. 11A to 12C show but a few of the possible different examples of functions that may be added by a port expansion. It is understood that other embodiments may include various other circuits.

In this way, a memory device may include an SPM portion and port expansion portion having data processing and/or data access circuits.

Embodiments of the invention may also include various methods. Examples of such embodiments will now be described with reference to a number of flow diagrams.

Figure 13:
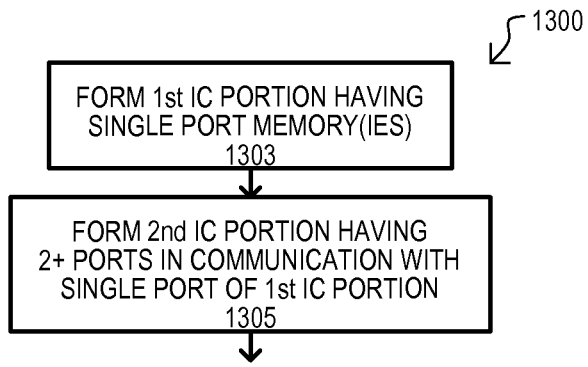
FIG. 13 is a flow diagram of a method according to an embodiment.

Referring to FIG. 13, a method 1300 according to one embodiment may include forming a first integrated circuit (IC) portion having one or more single port memories (box 1303). A method 1300 may also include forming a second IC portion having two or more ports in communication with a single port of the first IC portion (box 1305).

Figure 14:
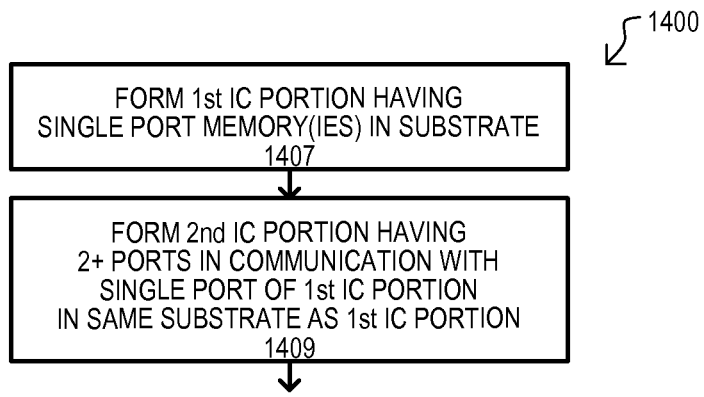
FIG. 14 is a flow diagram of a method according to a further embodiment.

Referring to FIG. 14, a method 1400 according to another embodiment may include forming a first IC portion having one or more single port memories in a substrate (box 1407). In addition, a second IC portion, having two or more ports in communication with a single port of the first IC portion, may be formed in the same substrate (box 1409).

Figure 15:
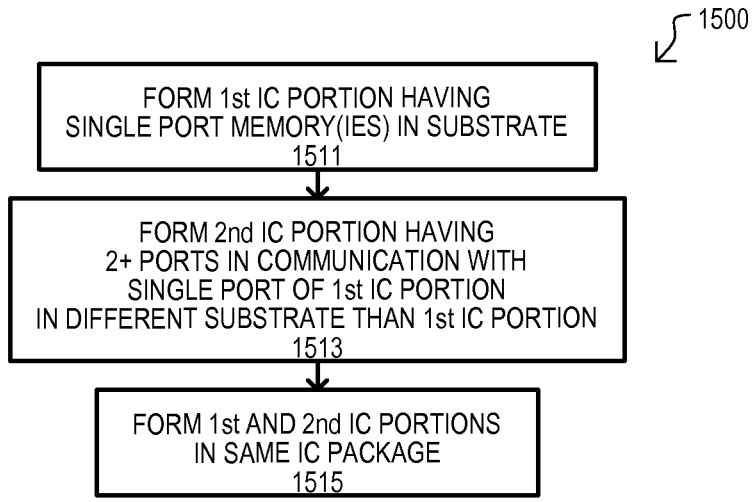
FIG. 15 is a flow diagram of a method according to yet another embodiment.

Referring to FIG. 15, a method 1500 according to another embodiment may include forming a first IC portion having one or more single port memories in a substrate (box 1511). A second IC portion having two or more ports in communication with a single port of the first IC portion may be formed in a different substrate (box 1513). The first and second IC portions may be formed in a same IC package (box 1515).

Figure 16:
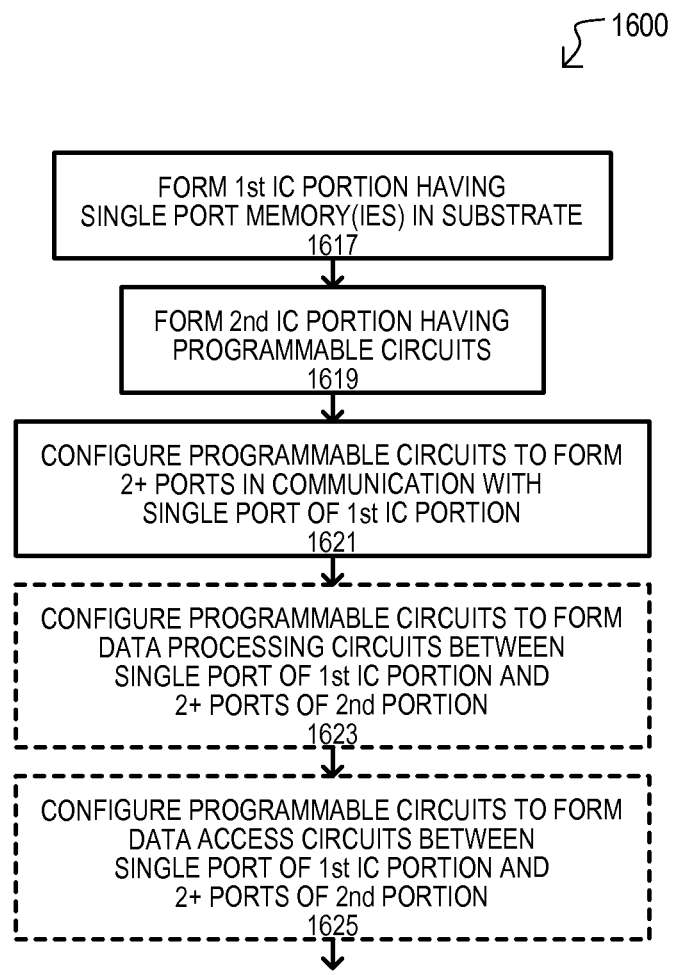
FIG. 16 is a flow diagram of a method according to an embodiment.

Referring now to FIG. 16, a method according to yet another embodiment is shown in a flow diagram and designated by the general reference character 1600. A method 1600 may include forming a first IC portion having one or more single port memories in a substrate (box 1617). A second IC portion may be formed that includes programmable circuits (box 1619). Programmable circuits may be configured to form two or more ports in communication with a single port of the first IC portion (box 1621).

Optionally, a method 1600 may include configuring programmable circuits to form data processing circuits between the single port of the $1^{st}$ IC portion and the two or more ports of the second IC portion (box 1623). In addition or alternatively, a method 1600 may optionally include configuring programmable circuits to form data access circuits between the single port of the $1^{st}$ IC portion and the two or more ports of the second IC portion (box 1625).

Figure 17:
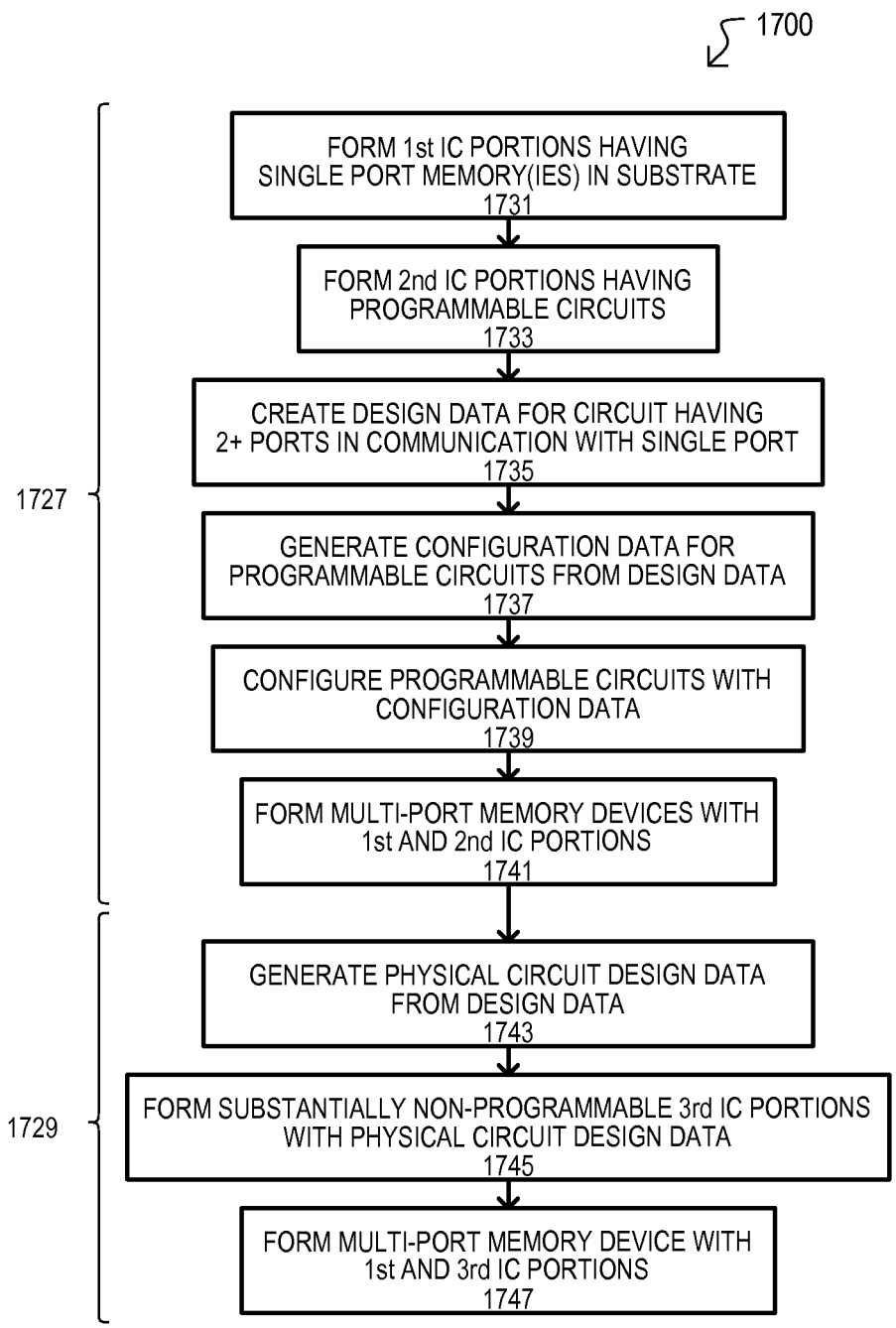
FIG. 17 is a flow diagram of a method according to an embodiment.

Referring to FIG. 17, a further method according to an embodiment is shown in flow diagram and designated by the general reference character 1700. A method 1700 may include a programmable device portion 1727 and a substantially non-programmable device portion 1729. A programmable device portion 1727 may include forming first IC portions having one or more single port memories in a substrate (box 1731). Second IC portions may be formed that includes programmable circuits (box 1733). Design data may then be created for a circuit having 2+ ports in communication with a single port (box 1735). Configuration data may then be generated form the design data that is compatible with the programmable circuits of the second IC portion (box 1737). Programmable circuits may then be programmed with the configuration data (box 1739). Multi-port memory devices may be formed with first and second IC portions (box 1741).

In this way, multi-port memory device may be formed with IC portions having programmable circuits.

Referring still to FIG. 17, a substantially non-programmable device portion 1729 may include generating physical circuit design data from the design data used to program the programmable circuits (box 1743). Third IC portions may then be formed with the physical circuit design data (box 1745). Multi-port memory devices may be formed with first and third IC portions (box 1747).

In this way, multi-port memory device may be formed with one IC portion having an SPM memory, and another IC portion with a circuit design used to program other devices.

Figure 18:
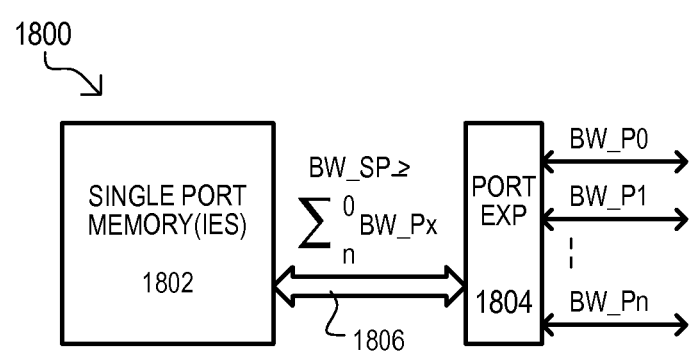
FIG. 18 is a block schematic diagram of a memory device according to another embodiment.

Referring now to FIG. 18, another multi-port memory device according to a further embodiment is shown in a block schematic diagram and designated by the general reference character 1800. In the particular embodiment shown, a port expansion portion 1804 may include "n+1" ports, each of which may transmit data at a maximum bandwidth BW_Px, (where "x" is a port number). Bandwidth values BW_Px, may be the same or may be different.

An SPM section 1802 may be capable of a bandwidth (BW_SP) with respect to port expansion portion 1804 equal to or greater than a total of all the maximum bandwidths of the ports together.

In this way, a bandwidth between a single memory section and a port expansion portion may be greater than or equal to the bandwidth on all ports together.

Figure 19:
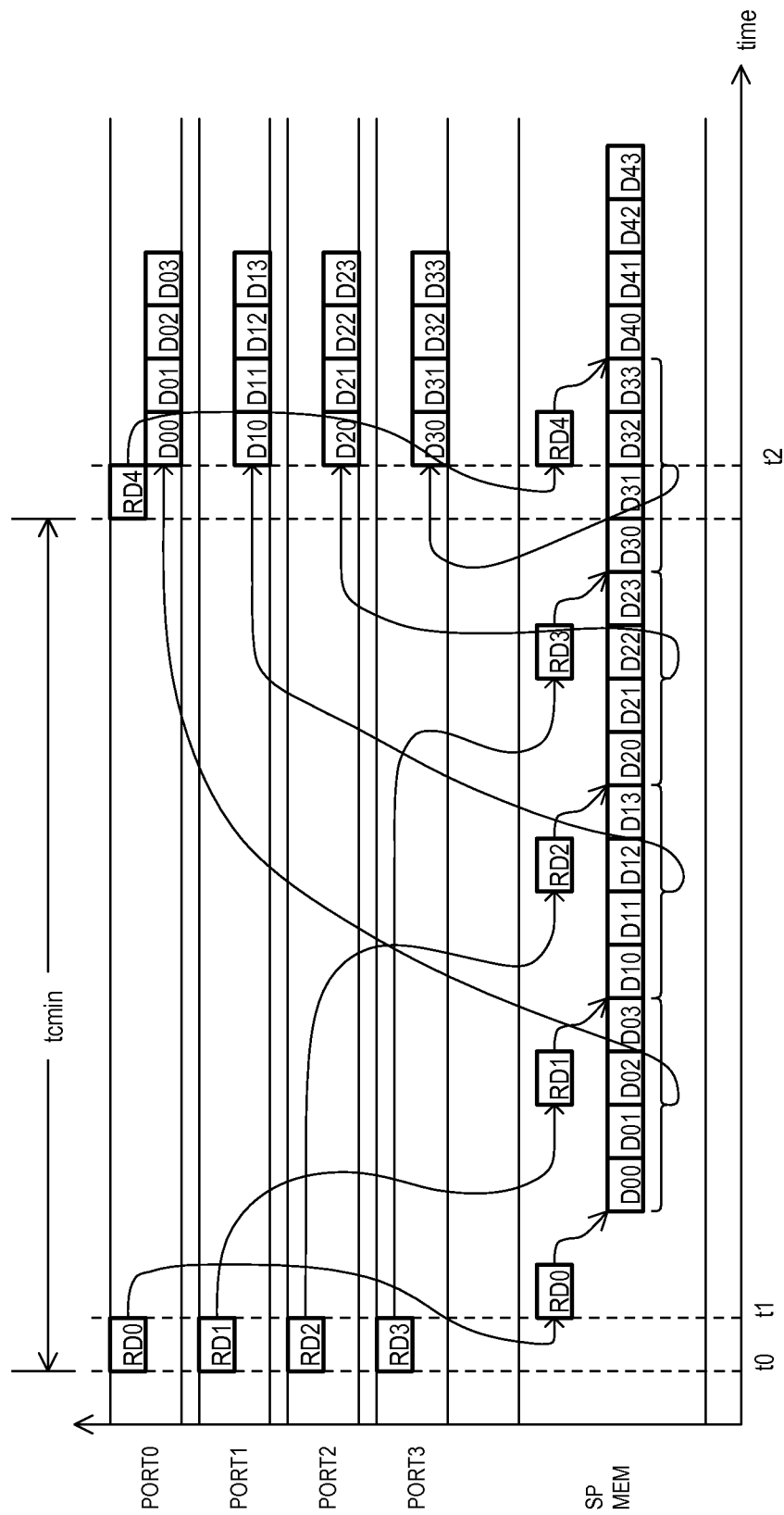
FIG. 19 is a timing diagram showing multi-port memory accesses according to one particular embodiment.

Referring now to FIG. 19, a timing diagram shows one very particular example of read latency in one very particular embodiment. The timing diagram of FIG. 19 shows commands and data on four different ports (PORT0 to PORT3), as well as operations within an SPM portion (SP MEM) accessed by such ports.

FIG. 19 shows a minimum time between commands (tc-min) for each port, and how such a value may be selected according to a worst case port access case. In the embodiment shown it is assumed that each port may read data in four value bursts. Thus, a worst case read access may result when all ports request a four value burst substantially simultaneously. As shown, a value tcmin may be selected to ensure that the SPM portion may service such a worst case request before outputting data for a subsequent request.

In particular, at time t0 each port may receive a four burst read request (RD0 to RD3).

Starting at time t1, such read requests may serviced within SPM portion in a sequence RD0, RD1, RD2, RD3 to output four data bursts in a corresponding sequence (D00-D03, D10-D13, D20-D23, D30-D33).

A port expansion portion may provide such data values on the ports at about time t2.

As shown, to ensure an SPM portion has sufficient bandwidth to service the request, a second read request on PORT0 may be issued until after a time tcmin.

Figure 20:
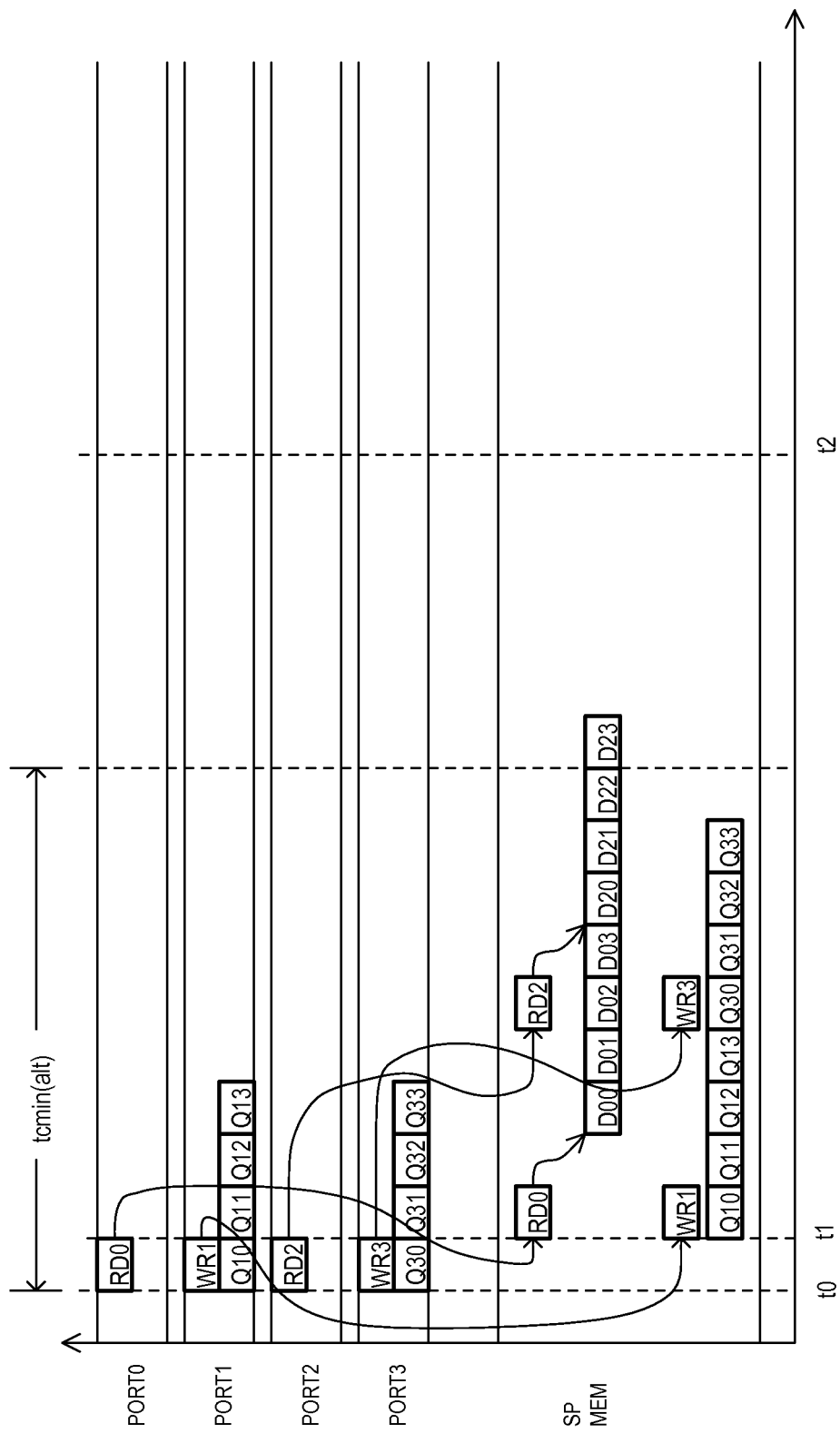
FIG. 20 is a timing diagram showing multi-port memory accesses according to another particular embodiment.

Referring now to FIG. 20, a timing diagram shows one very particular example of an alternate read latency in one very particular embodiment. The timing diagram of FIG. 20 shows the same ports and SPM portion as FIG. 19. However, unlike FIG. 19, two ports (PORT1 and PORT3) may receive write commands at time t0.

FIG. 20 shows an example of a SPM portion that may be a quad data rate type memory device in which write requests may be serviced concurrently with read requests. Accordingly, if port accesses types are varied (e.g., at least one port writes or is idle) a minimum time between commands may be reduced.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit device, comprising:
   a first integrated circuit (IC) portion having a single memory port to access at least one memory array, the single port including a first set of address, control and data paths; and
   a second IC portion comprising at least a first memory port and a second memory port for providing access to the memory locations of the first IC portion through the single memory port of the first IC portion, wherein the single memory port of the first IC portion is different from the first memory port and the second memory port of the second IC portion.

2. The integrated circuit device of claim 1, wherein:
   the single port of the first IC portion is selected from: a parallel memory port that transmits bits of a same data value in parallel with one another on separate signal lines, and a serial memory port that transmits bits of a same data value in on a same signal line.

3. The integrated circuit device of claim 1, wherein:
   the first or second port of the second IC portion is selected from a parallel memory port that transmits bits of a same multi-bit data value in parallel with one another on separate signal lines, and a serial memory port that transmits bits of a same multi-bit data value in on a same signal line.

4. The integrated circuit device of claim 3, wherein:
   the first and second ports of the second IC portion are parallel memory ports of different types.

5. The integrated circuit device of claim 1, wherein:
   the second IC portion comprises programmable circuits configurable in response to configuration data to create communication paths between the first and second memory ports and the single port of the first IC portion.

6. The integrated circuit device of claim 1, wherein:
   the first IC portion and second IC portion are part of the same monolithic integrated circuit.

7. The integrated circuit device of claim 1, further including:
the first IC portion is part of a first substrate;
the second IC portion is part of a second substrate; and
the first substrate and second substrate are electrically connected to one another in a same IC package.

8. The integrated circuit device of claim 1, wherein:
first IC portion includes
a write data bus, a read data bus separate from the write data input, a write register coupled to the write data bus, a read data register coupled to the read data bus, a write address decoder coupled to an address bus that decodes write addresses, and a read address decoder coupled to the address bus that decodes read addresses.

9. A method, comprising:
accessing a first integrated circuit (IC) portion, having at least one memory array accessed by a single port, with at least one second IC portion electrically coupled to the single port of the first IC portion, the second IC portion having at least a first memory port and a second memory port for accessing the memory array through the single port of the first IC portion, wherein the single port of the first IC portion is different from the first memory port and the second memory port of the second IC portion.

10. The method of claim 9, further including:
configuring programmable circuits in the second IC portion to create communication paths between the first and second memory ports and the single port of the first IC portion.

11. The method of claim 10, further including:
configuring the programmable circuits to include data processing circuits between the first and second memory ports and the single memory port.

12. The method of claim 10, further including:
configuring the programmable circuits to include data access control circuits between the first and second memory ports and the single memory port.

13. The method of claim 9, wherein:
the first IC portion includes single port memory circuits formed in a substrate; and
the second IC portion is formed in the same substrate.

14. The method of claim 9, wherein:
the first IC portion includes single port memory circuits in a first substrate;
the second IC portion is formed in a second substrate; and
the first and second substrates are assembled in a same multi-die integrated circuit package.

15. The method of claim 9, further including:
the second portion comprises programmable circuits configured with configuration data generated from design data for a circuit that provides communication paths between at least the first memory port and the second memory port and the single port of the first IC portion;
in a first type multi-port memory device, accessing the single port in at least one first IC portion through multiple ports in at least one second IC portion; and
in a second type multi-port memory device, accessing the single port in at least another first IC portion through multiple ports in at least one third IC portion, the third IC portion having substantially non-programmable circuits designed with the design data.

16. A multi-port memory device, comprising:
a single port memory integrated circuit portion (IC) that provides access to at least one memory array via a single port; and
a multi-port IC portion having at least two memory ports that provide access to the single port of the single port memory IC portion, wherein the single port is different from the at least two memory ports.

17. The multi-port memory device of claim 16, wherein:
the multi-port IC portion comprises programmable circuits configurable to provide at least communication paths between the first and second memory ports and the single port in response to configuration information.

18. The multi-port memory device of claim 17, wherein:
the programmable circuits are configured to include data processing circuits between the first and second memory ports and the single port, the data processing circuits selected from: data encryption circuits that encrypt write data before writing such data into the single port memory IC portion, data decryption circuits that decrypt read data output from the single port memory IC portion, an error code generation circuit that generates error codes from data values of the single port memory IC portion, and an error correction circuit that error corrects data values of the single port memory IC portion based on corresponding error correction codes.

19. The multi-port memory device of claim 17, further including:
the programmable circuits are configured to include data access circuits between the first and second memory ports and the single port, the data access circuits selected from: authentication circuits that allow access to the single port memory IC portion based on comparing a received authentication value with a generated authentication value, partition circuits that logically divide that address space of the single port memory IC portion, built-in-self-test circuits, and redundancy circuits.

20. The multi-port memory device of claim 17, wherein:
the programmable circuits comprise a field programmable gate array architecture that includes at least one programmable logic core coupled to data lanes by programmable multiplexers and programmable de-multiplexers, and switch circuits for selectively connecting data lanes to one another.

* * * * *